US006577155B2

(12) United States Patent
Stewart et al.

(10) Patent No.: US 6,577,155 B2
(45) Date of Patent: Jun. 10, 2003

(54) APPARATUS AND METHOD FOR IMPEDANCE CONTROL

(75) Inventors: Richard William Stewart, San Diego, CA (US); Bruce L. Harlacher, San Diego, CA (US)

(73) Assignee: Fischer Custom Communications, Inc., Torrance, CA (US)

( * ) Notice: Subject to any disclaimer, the term of this patent is extended or adjusted under 35 U.S.C. 154(b) by 0 days.

(21) Appl. No.: 09/918,362

(22) Filed: Jul. 30, 2001

(65) Prior Publication Data

US 2003/0020559 A1 Jan. 30, 2003

(51) Int. Cl.[7] .................................... H03H 7/38
(52) U.S. Cl. .................................... 326/32; 333/33
(58) Field of Search .......................... 333/32, 33, 17.3, 333/24 R, 22; 343/856, 860, 861

(56) References Cited

U.S. PATENT DOCUMENTS

| | | | | |
|---|---|---|---|---|
| 3,631,333 A | * | 12/1971 | Pichal | 323/355 |
| 4,008,478 A | * | 2/1977 | Ikrath et al. | 343/720 |
| 4,647,871 A | * | 3/1987 | Turner, Jr. | 330/298 |
| 4,845,606 A | * | 7/1989 | Herbert | 363/24 |
| 4,945,317 A | * | 7/1990 | Sato et al. | 330/301 |
| 5,633,648 A | | 5/1997 | Fischer | 343/788 |
| 5,877,598 A | | 3/1999 | Pistemaa | 315/370 |
| 6,211,749 B1 | | 4/2001 | Yuzurihara et al. | 333/17.3 |
| 6,307,445 B1 | * | 10/2001 | Makinen et al. | 333/32 |

FOREIGN PATENT DOCUMENTS

| | | |
|---|---|---|
| EP | 0 124 260 A2 | 11/1984 |
| EP | 0 801 494 A2 | 10/1997 |
| JP | 01310418 A | 12/1989 |
| JP | 2000165175 A | 6/2000 |

OTHER PUBLICATIONS

*Common Mode Impedance Stabilization Network*, Part No. F–CMISN–CAT5, Fischer Custom Communications, Inc., 2 pages (2000).

* cited by examiner

*Primary Examiner*—Michael Tokar
*Assistant Examiner*—James H Cho
(74) *Attorney, Agent, or Firm*—Ladas & Parry

(57) ABSTRACT

Controlling the common mode impedance for a circuit, conductor, or multiple conductor cable by incorporating the circuit or conductor into the primary of a transformer. The secondary of the transformer is coupled to a secondary impedance selected so that the desired impedance is obtained. A capacitive shunt may be added to buffer the intrinsic primary impedance. The intrinsic impedance of a conductive antenna structure is controlled by deploying a portion of the antenna structure as the primary of a transformer and coupling the secondary of the transformer to a selectable secondary impedance.

16 Claims, 5 Drawing Sheets

$Z_1$ 40 43 31 $Z_c$

APPARATUS AND METHOD FOR IMPEDANCE CONTROL

FIELD OF THE INVENTION

The present invention relates to an apparatus and method for controlling the common mode impedance for a circuit, conductor or cable without making a direct connection to the circuit, conductor or cable.

BACKGROUND OF THE INVENTION

Many testing and design applications require establishing and controlling a stable, predictable common mode impedance for a circuit, conductor or cable with multiple conductors. A typical requirement in design applications is to match the impedance of a first circuit or conductor with that of a second circuit or conductor. In testing applications, one may wish to vary the impedance of a second circuit having an impedance $Z_L$ when coupled to a first circuit having an impedance $Z_{in}$ without varying the components of the second circuit.

A typical circuit for controlling the impedance or matching the impedance between a first circuit having an internal impedance $Z_{in}$ and a second circuit having a load impedance $Z_L$ is shown in FIG. 1. In FIG. 1, a series impedance $Z_{series}$ and a parallel impedance $Z_{parallel}$ provide the necessary impedance control between the internal impedance $Z_{in}$ and the load impedance $Z_L$. Either or both the series impedance $Z_{series}$ and the parallel impedance $Z_{parallel}$ may be controllable to provide the desired impedance control. FIGS. 2A to 2H show a plurality of circuit constructions known in the art to provide impedance control between a first circuit and a second circuit by using variable inductors 21 and variable capacitors 23.

These prior art apparatus and methods require that one or more components be directly coupled between the first circuit and the second circuit. Such a coupling generally requires that the conductors between the two circuits be breached by, for example, cutting the conductors and wiring in the components for matching or controlling the impedance. Hence, prior art apparatus and methods for the insertion of impedance control elements requires one or more invasive connections.

Many testing and design applications require establishing and controlling a stable, predictable common mode impedance for a circuit, cable, or multiple conductor cable without making a direct, ohmic, or other invasive connection to the circuit, conductor, or multiple conductor cable. Further, these applications frequently require maintaining the impedance over a wide frequency range.

Therefore, there exists a need in the art for a method and apparatus for providing a stable, predictable, and wide frequency range impedance without making an invasive connection.

SUMMARY OF THE INVENTION

It is an object of the present invention to provide a method and apparatus for providing stable and predictable control over the impedance of a circuit, conductor, or multiple conductor cable without requiring a direct, ohmic, or invasive connection. It is a further object of the present invention to provide such impedance control over a wide frequency range. Another object of the present invention is to provide for impedance control over antenna structures.

In accordance with an aspect of the present invention, an embodiment of the present invention provides a method for controlling the input impedance of a circuit having one or more conductors and having an intrinsic impedance, the method comprising the steps of: disposing a portion of a conductor or conductors as a primary of a transformer; coupling a secondary of the transformer to a secondary impedance; coupling another portion of the conductor or conductors to ground with a capacitive impedance; and controlling the secondary impedance to provide the desired input impedance.

In accordance with another aspect of the present invention, an embodiment of the present invention provides an apparatus for controlling the input impedance of a circuit having one or more conductors and having an intrinsic impedance, the apparatus comprising: a transformer having a primary and a secondary, the primary having one or more primary turns and the secondary having one or more secondary turns, and at least one conductor being disposed as the primary; a secondary impedance coupled to the secondary; and a capacitive element coupling the conductor to ground.

In both the method and apparatus described above, the transformer may have a turns ration between the primary and the secondary of N, such that the desired input impedance $Z_{in}$ is given by $Z_{in}=N^2Z_1$, where $Z_1$ is the secondary impedance. The capacitive element may be provided by deploying a portion of the conductor closely proximate to a ground plane or coiling the conductor and the ground plane together. The capacitive element may also be provided by capacitive elements coupled between multiple conductors and a common core transformer, where the common core transformer is coupled to ground.

In accordance with another aspect of the present invention, an embodiment of the present invention provides a method for controlling the intrinsic impedance of a conductive antenna structure comprising the steps of: disposing a portion of the conductive antenna structure as a primary of a transformer; coupling a secondary of the transformer to a secondary impedance; and controlling the secondary impedance to provide the desired input impedance.

In accordance with another aspect of the present invention, an embodiment of the present invention provides an apparatus for controlling the intrinsic impedance of a conductive antenna structure, the apparatus comprising: a transformer having a primary and a secondary, a portion of the conductive antenna structure comprising the primary; and a secondary impedance coupled to the secondary of the transformer.

In both the method and apparatus described above, multiple secondary impedances may be coupled to the secondary of the transformer, where each secondary impedance may be separately selected by a switch. Each secondary impedance can then provide different operating characteristics for the antenna structure. The operating characteristics may be such to provide maximum effectiveness for the antenna structure with one selected secondary impedance and minimum effectiveness with another selected secondary impedance.

DETAILED DESCRIPTION OF PREFERRED EMBODIMENTS

Figure 1:
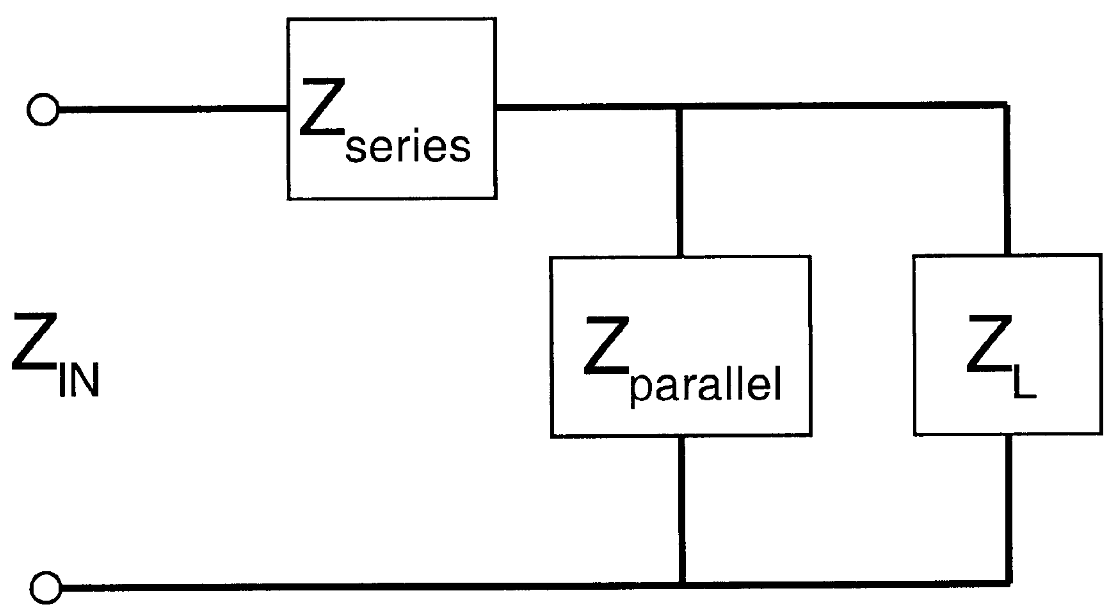
FIG. 1 shows a typical circuit for matching an input impedance with a load impedance.
Figure 2A:
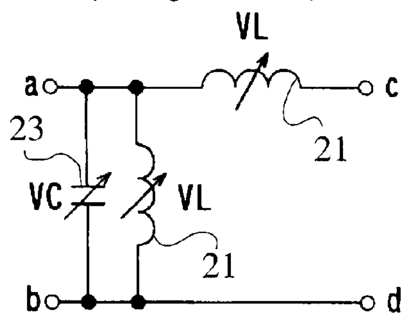
FIGS. 2A to 2H (prior art) show circuit constructions of different circuits known in the prior art for providing impedance matching.
Figure 2B:
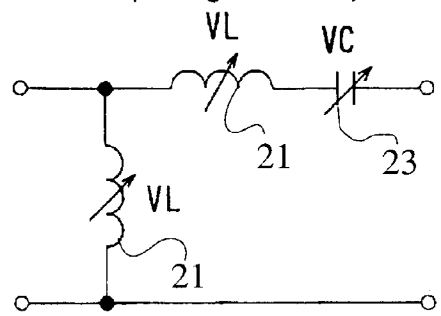
Figure 2C:
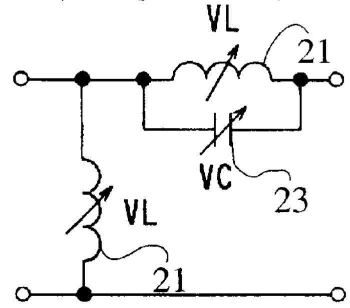
Figure 2D:
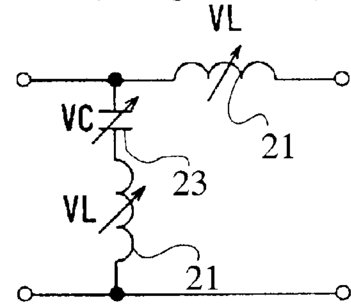
Figure 2E:
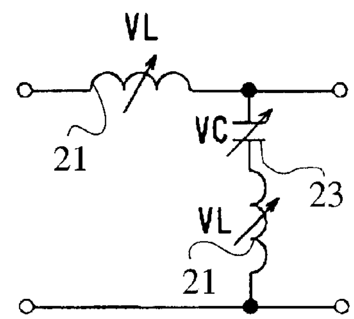
Figure 2F:
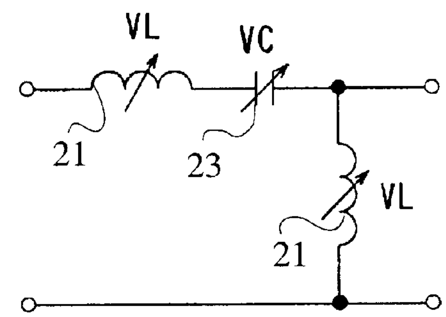
Figure 2G:
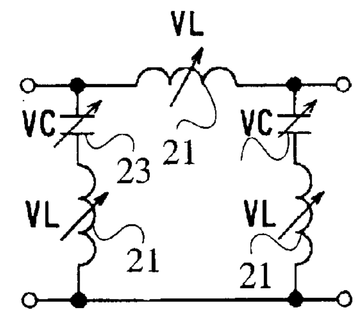
Figure 2H:
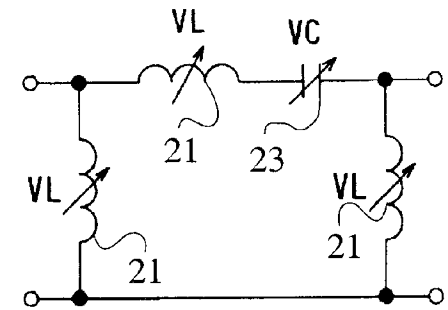
Figure 3:
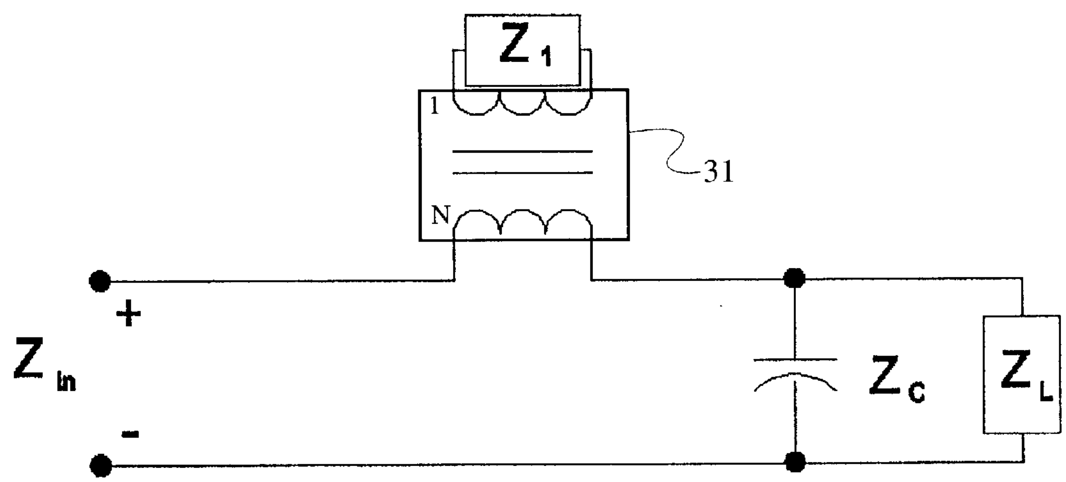
FIG. 3 is a schematic diagram of a circuit according to the present invention.

FIG. 3 is a schematic diagram of a circuit for providing a stable, controllable impedance without an invasive connection according to the present invention. In FIG. 3, $Z_L$ represents the fixed load impedance of a circuit or cable and $Z_{in}$ represents the total input impedance of the controlled circuit. A coupling transformer 31 couples a secondary load impedance $Z_1$ to the circuit. A capacitive impedance $Z_C$ is provided between the transformer 31 and the load impedance. Preferably, the transformer 31 comprises a plurality of primary turns and one or more secondary turns. N represents the ratio of primary turns to the secondary turns. One conductor of the circuit with the load impedance $Z_L$ is disposed within or adjacent the transformer 31 so as to be inductively coupled to the secondary load impedance $Z_1$.

In the circuit depicted in FIG. 3, the input impedance $Z_{in}$ for an ideal transformer 31 is given by:

$$Z_{in}=(Z_L+Z_C)/(Z_LZ_C)+N^2Z_1$$

$Z_L$=the original load or intrinsic impedance $Z_C$=a capacitive impedance to ground N=ratio of primary turns to secondary turns of the transformer $Z_1$=the secondary load impedance If the parallel impedance combination of $Z_L$ and $Z_C$ are small relative to $N^2Z_1$, then the input impedance is determined and controlled by $Z_1$. Therefore, adjusting the impedance provided by the secondary load impedance $Z_1$ provides for control of the input impedance $Z_{in}$. Control of the secondary load impedance $Z_1$ may also compensate for non ideal transformer behavior by the transformer 31.

The secondary impedance may be either a single simple element or a complex network depending upon the impedance control required. The secondary impedance may also comprise passive elements, such as resistors, capacitors and inductors, active elements that provide the necessary reactive and resistive functions, or some combination of passive and active elements. Generally, satisfactory impedance control will require a secondary impedance that comprises both resistive and reactive elements. Note also that physical realizations of the circuit shown in FIG. 3 will include parasitic effects such as inter-winding capacitance, leakage inductance and non-ideal behavior of the lumped elements. The elements of the secondary impedance may be selected to compensate for these effects.

Preferred embodiments of the present invention may use a transformer that has a two turn primary and a single turn secondary. Preferably, the transformer has a multiple torroidal, very high permeability core. Since the present invention may be applied to a wide variety of conductors, it is preferred that the transformer used for inductively coupling the primary conductor to the secondary impedance be designed and fabricated for each specific application of the invention. It is unlikely that commercially available transformers can be directly used or modified for use in the present invention.

Figure 4:
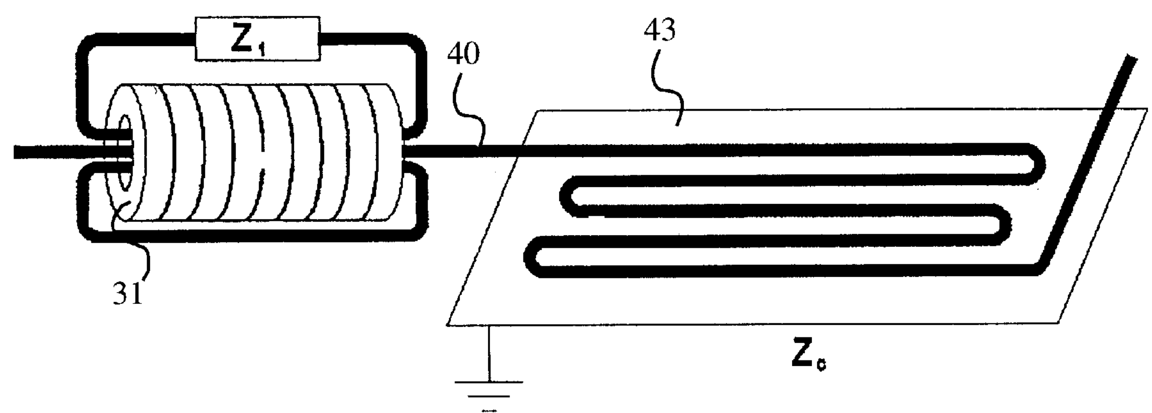
FIG. 4 shows an embodiment of the present invention where shunt capacitance is provided by a flat ground plane.

Certain regulatory tests require maintaining a fixed (typically 150 ohm) common mode impedance without significantly disturbing the differential mode or line to line propagation of multiple pairs, independent of intrinsic common mode impedance of the equipment under test. FIG. 4 shows a method according to the present invention for maintaining the required common mode impedance.

In FIG. 4, the coupling transformer 31 couples a multiple conductor test cable 40 to the secondary load impedance $Z_1$. The coupling transformer 31 is realized by using the test cable as the primary of the transformer 31. Note that all conductors of the multiple conductor cable, in parallel, form the primary of the coupling transformer 31. The transformer core and the primary turns ratio are selected to provide adequate primary inductance, and to minimize intra-winding capacitance over the desired frequency range. The secondary is a single turn having low inductance. The secondary load inductance is selected so $N^2Z_1$ gives the desired load impedance. Trimming capacitance elements may be used to compensate for residual secondary inductance.

The intrinsic load impedance $Z_L$ may be unknown and may be either higher or lower than the desired input impedance. As discussed above, a capacitive impedance $Z_C$ may be used such that the parallel combination of $Z_C$ and $Z_L$ is small relative to $N^2Z_1$. Preferably, the capacitance $Z_C$ does not significantly affect the line the line impedance. The capacitance $Z_C$ may be provided by deploying a length of the test cable 40 closely proximate a ground plane 43. Preferably, the test cable 40 is immersed in a lossy high dielectric to reduce the required cable length and to minimize transmission line reflection and resonant effects.

Figure 5:
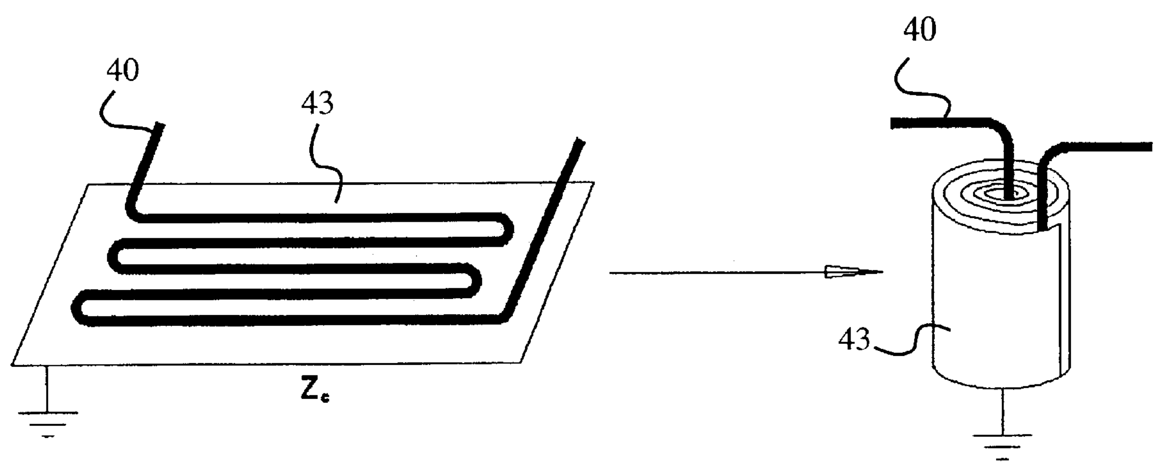
FIG. 5 shows an embodiment of the present invention where shunt capacitance is provided by a coiled ground plane.

As shown in FIG. 4, coiling the test cable 40 on top of the ground plane 43 provides the parallel capacitance $Z_C$. In such a configuration, the ground plane 43 may require a large surface area to provide the required capacitance. FIG. 5 shows an alternative deployment of the ground plane 43. As shown in FIG. 5, the ground plane 43 and the test cable 40 may be wrapped or coiled around each other to reduce the overall dimensions of the ground plane 43 needed to produce the required capacitance $Z_C$.

Figure 6:
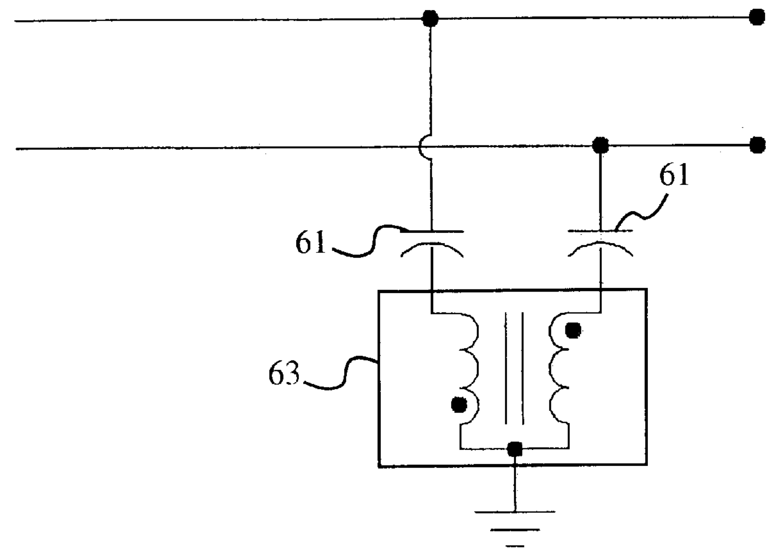
FIG. 6 shows an embodiment of the present invention where shunt capacitance is provided by capacitive elements connected to ground via a common core transformer.

Another method and apparatus for providing the parallel capacitance $Z_C$ is shown in FIG. 6. In FIG. 6, shunt capacitors 61 are connected to ground via a common core transformer 63. The windings of the transformer 63 are opposed such that the windings present a high differential mode or wire to wire impedance while providing a common mode shunt through the capacitance $Z_C$ to ground. Note that this method and apparatus eliminates the need for a ground plane to be deployed proximate the test cable, but electrical connections to the conductors within the test cable are required. FIG. 6 shows only the capacitive coupling of both wires of a single wire pair to ground, but alternative embodiments of the present invention provide for the capacitive coupling of multiple wire pairs to ground. Multiple pair, common core transformers are known in the art and may be used to provide capacitive coupling between multiple wire pairs and ground.

The Common Mode Impedance Stabilization Network, Part No. F-CMISN-CAT5, product of Fischer Custom Communications, Inc. of Torrance, Calif. provides for impedance control based on an embodiment of the present invention. The F-CMISN-CAT5 device provides for a common mode impedance that is well defined with respect to a reference ground plane over a frequency range of 150 kHz to 30 MHz. One application of the F-CMISN-CAT5 device is to support conducted emissions testing of Information Technology Equipment. Prior art devices that support such testing require the positioning of ferrites on the cable under test to achieve the desired common mode impedance. Embodiments of the present invention eliminate the need to reposition the ferrites for every emission frequency tested.

Embodiments of the present invention may be used to modify the natural impedance of structural elements used as antennas or radiating elements. As is known in the art, metallic structures may be used to transmit or receive radio frequency energy. See, for example, U.S. Pat. No. 5,633,648, "RF Current-Sensing Coupled Antenna Device," issued May 27, 1997, incorporated herein by reference. The effectiveness of the metallic structure is established, in part, by the intrinsic impedance of the metallic structure. However, the intrinsic impedance of these metallic structures is established by the size, shape, and composition of the structure. Hence, the intrinsic impedance of the metallic structure may vary significantly from that needed to effectively receive or radiate energy at a desired frequency or frequencies.

Figure 7:
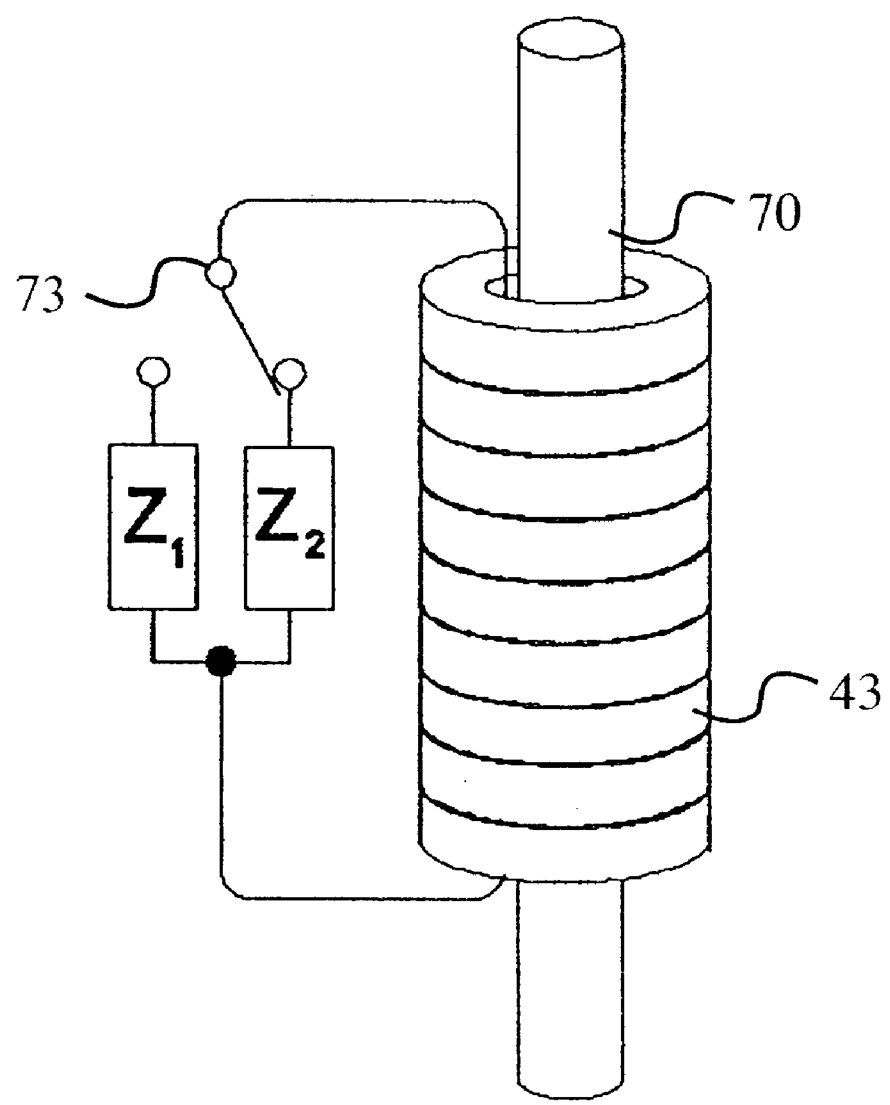
FIG. 7 shows an embodiment of the present invention providing impedance control for an antenna structure.

FIG. 7 depicts the deployment of an embodiment of the present invention to provide for modification of the intrinsic impedance of an antenna structure. The coupling transformer 31 is deployed such that an antenna structure 70 serves as the single turn primary. The antenna structure 70 may be any metallic structure that is used to radiate or receive radio frequency energy. Core materials, geometry, and the location of the cores of the coupling transformer 31 may be chosen to optimize the performance of the transformer for a specific frequency range. Also, the intrinsic impedance of the antenna structure 70 may be sufficiently low such that the parallel capacitance $Z_C$ is not required.

As shown in FIG. 7, two secondary impedances $Z_1$, $Z_2$ may be switch coupled to the coupling transformer 31. A simple switch 73 may be used to select the desired secondary impedance to be inductively coupled to the antenna structure 70 to provide the desired input impedance. The values of the secondary impedances $Z_1$, $Z_2$ may chosen to provide two different modes of operation for the antenna structure. For example, the value of the first secondary impedance $Z_1$ may be chosen to modify the intrinsic impedance of the antenna structure 70 to optimize the effectiveness of the structure as an antenna. The value of the second secondary impedance $Z_2$ may then be chosen to modify the intrinsic impedance of the antenna structure 70 to minimize the effectiveness of the structure 70 as an antenna, as might be desired to reduce the radar cross section of the structure or to reduce unintentional electromagnetic emissions from the structure.

In a similar fashion, multiple secondary impedances may be switch coupled to the coupling transformer 31 to tune the antenna structure 70 for different operating bands or frequencies.

From the foregoing description, it will be apparent that the present invention has a number of advantages, some of which have been described herein, and others of which are inherent in the embodiments of the invention described or claimed herein. Also, it will be understood that modifications can be made to the apparatus and method described herein without departing from the teachings of subject matter described herein. As such, the invention is not to be limited to the described embodiments except as required by the appended claims.

What is claimed is:

1. A method for controlling the input impedance of a circuit having multiple conductors and having an intrinsic impedance, the method comprising the steps of:

(a) disposing a portion of each conductor of the multiple conductors as a primary of a transformer;

(b) coupling a secondary of the transformer to a secondary impedance;

(c) coupling another portion of each conductor to ground with a capacitive impedance;

(d) controlling the secondary impedance to provide the desired input impedance.

2. The method according to claim 1, wherein the input impedance is represented as $Z_{in}$, the secondary impedance is represented as $Z_1$, the transformer has one or more primary turns, one or more secondary turns, and the ratio of primary turns to secondary turns is represented as N, and the desired input impedance is given by:

$$Z_{in}=N^2Z_1.$$

3. A method for controlling the input impedance of a circuit having one or more conductors and having an intrinsic impedance, the method comprising the steps of:

(a) disposing a portion of at least one conductor of the one or more conductors as a primary of a transformer;

(b) coupling a secondary of the transformer to a secondary impedance;

(c) coupling another portion of the at least one conductor to ground with a capacitive impedance; and (d) controlling the secondary impedance to provide the desired input impedance, wherein the transformer has a multiple torroidal core and the portion of the at least one conductor is disposed within the center of the multiple torroidal core.

4. The method according to claim 3, wherein the transformer has a two turn primary and a single turn secondary.

5. A method for controlling the input impedance of a circuit having one or more conductors and having an intrinsic impedance, the method comprising the steps of:

(a) disposing a portion of at least one conductor of the one or more conductors as a primary of a transformer;

(b) coupling a secondary of the transformer to a secondary impedance;

(c) coupling another portion of the at least one conductor to ground with a capacitive impedance; and (d) controlling the secondary impedance to provide the desired input impedance, wherein the capacitive impedance is provided by disposing a length of the at least one conductor proximate to a ground plane.

6. The method according to claim 5, wherein the length of the at least one conductor and the ground plane are wrapped around each other in a coil.

7. The method according to claim 5, wherein the length of the at least one conductor is disposed in a lossy high dielectric.

8. A method for controlling the input impedance of a circuit having one or more conductors and having an intrinsic impedance, the method comprising the steps of:

(a) disposing a portion of at least one conductor of the one or more conductors as a primary of a transformer;

(b) coupling a secondary of the transformer to a secondary impedance;

(c) coupling another portion of the at least one conductor to ground with a capacitive impedance; and (d) controlling the secondary impedance to provide the desired input impedance, wherein the at least one conductor comprises two conductors of the one or more conductors and the capacitive impedance comprises each of the two conductors being coupled to separate windings of a common core transformer through shunt capacitive elements, the common core transformer being coupled to ground and the separate windings being opposed to present a high differential mode.

9. An apparatus for controlling the input impedance of a circuit having multiple conductors and having an intrinsic impedance, the apparatus comprising:

a transformer having a primary and a secondary, the primary having one or more primary turns and the secondary having one or more secondary turns, and each conductor of the multiple conductors being disposed as the primary;

a secondary impedance coupled to the secondary; and a capacitive element coupling the at least one conductor to ground.

10. The apparatus according to claim 9, wherein the input impedance is represented as $Z_{in}$, the secondary impedance is represented as $Z_1$, the ratio of primary turns to secondary turns is represented as N, and the input impedance is given by:

$$Z_{in}=N^2Z_1.$$

11. An apparatus for controlling the input impedance of a circuit having one or more conductors and having an intrinsic impedance, the apparatus comprising:

a transformer having a primary and a secondary, the primary having one or more primary turns and the secondary having one or more secondary turns, and at least one conductor of the one or more conductors being disposed as the primary;

a secondary impedance coupled to the secondary; and a capacitive element coupling the at least one conductor to ground, wherein the transformer has a multiple torroidal core and the at least one conductor is disposed within the center of the multiple torroidal core.

12. The apparatus according to claim 11, wherein the transformer has a two turn primary and a single turn secondary.

13. An apparatus for controlling the input impedance of a circuit having one or more conductors and having an intrinsic impedance, the apparatus comprising:

a transformer having a primary and a secondary, the primary having one or more primary turns and the secondary having one or more secondary turns, and at least one conductor of the one or more conductors being disposed as the primary;

a secondary impedance coupled to the secondary; and a capacitive element coupling the at least one conductor to ground, wherein the capacitive element is provided by disposing a length of the at least one conductor proximate to a ground plane.

14. The apparatus according to claim 13, wherein the length of the at least one conductor and the ground plane are wrapped around each other in a coil.

15. The apparatus according to claim 13, wherein the length of the at least one conductor is immersed in a lossy high dielectric.

16. An apparatus for controlling the input impedance of a circuit having one or more conductors and having an intrinsic impedance, the apparatus comprising:

a transformer having a primary and a secondary, the primary having one or more primary turns and the secondary having one or more secondary turns, and at least one conductor of the one or more conductors being disposed as the primary;

a secondary impedance coupled to the secondary; and a capacitive element coupling the at least one conductor to ground, wherein the at least one conductor comprises two conductors of the one or more conductors and the capacitive element comprises each of the two conductors being coupled to separate windings of a common core transformer through shunt capacitive elements, the common core transformer being coupled to ground and the separate windings being opposed to present a high differential mode.

* * * * *